United States Patent [15] 3,648,116

Baugher et al. [45] Mar. 7, 1972

[54] MULTICIRCUIT HYBRID MODULE AND METHOD FOR MAKING

[72] Inventors: Dale Milton Baugher, Flemington; Earl Thomas Hausman, Somerset, both of N.J.

[73] Assignee: RCA Corporation

[22] Filed: Sept. 17, 1970

[21] Appl. No.: 72,943

[52] U.S. Cl. ....................317/101 A, 174/52 S, 174/DIG. 3, 317/101 CC, 321/8 R

[51] Int. Cl. ....................................H02b 1/04, H02b 9/00

[58] Field of Search................174/DIG. 3, 52 S, 52 PE, 68.5; 321/8 R; 317/101 A, 101 C, 101 CC, 101 CM, 101 CP, 101 D

[56] References Cited

UNITED STATES PATENTS 3,385,426 5/1968 May et al. ........................174/DIG. 3

*Primary Examiner*—Darrell L. Clay
*Attorney*—Glenn H. Bruestle

[57] ABSTRACT

Disclosed is a hybrid circuit module in a package having a mounting surface. A plurality of circuit elements capable of a number of circuit configurations are disposed on the mounting surface. External termination is provided by a flat metal plate having terminal fingers extending through the package. Connecting means within the package are connected between the circuit elements and the fingers; the connecting means are common to all of the different circuit configurations. The flat plate is sheared to isolate some of the fingers and define only one of the circuit configurations.

5 Claims, 8 Drawing Figures

INVENTORS
Dale M. Baugher &
Earl T. Hausman
BY Herbert R. Allen
ATTORNEY

INVENTORS
Dale M. Baugher &
Earl T. Hausman
BY Herbert K. Allen
ATTORNEY

INVENTORS
Dale M. Baugher &
Earl T. Hausman
BY Herbert K. Allen
ATTORNEY INVENTORS
Dale M. Baugher &
Earl T. Hausman
BY Herbert L. Allen
ATTORNEY

MULTICIRCUIT HYBRID MODULE AND METHOD FOR MAKING

BACKGROUND OF THE INVENTION

The present invention relates to modular circuit arrangements and packages.

Modular circuit arrangements, such as integrated and hybrid circuits, are now being used in many electronic applications to replace printed circuits and circuits made by conventional wiring techniques. In many instances, the circuit elements used in one of these modules is capable of a number of useful circuit configurations. However, once the circuit elements are disposed in the package and the package is sealed, use of the module is limited to only one of those circuit configurations, because of the termination systems normally employed. Thus, an unreasonably large inventory is required to have all of the possible circuit configurations available at all times. It would therefore be desirable to employ techniques which would allow selection of any one of the possible circuit configurations from one package after that package is fabricated and sealed.

SUMMARY OF THE INVENTION

The present invention comprises a modular circuit arrangement in a package having a mounting surface. A plurality of circuit elements capable of a number of different circuit configurations are mounted on the mounting surface. Termination means which define one of the circuit configurations is provided between the mounting surface and points external to the package. Connecting means which are common to all of the circuit configurations is provided within the package between the circuit elements and the termination means.

The invention also comprises a method for making the modular circuit. The method includes providing a pattern of internal connections between the circuit elements and a plurality of metal fingers on the periphery of said mounting surface, such that when external connections are made to the fingers, different circuit configurations can be obtained without changing the internal connections. The fingers are connected externally to a common metal plate, and the plate is sheared to isolate certain of the fingers and thus define one of the circuit configurations.

THE DRAWING

FIG. 1*a* is a top plan view of a multicircuit hybrid module in accordance with the present invention.

FIG. 1*b* is a schematic diagram of the circuit configuration of the module of FIG. 1*a*.

FIG. 2*a* is a top plan view of the module of FIG. 1*a* defining a first one of the different circuit configurations.

FIG. 2*b* is a schematic diagram of the circuit of FIG. 2*a*.

FIG. 3*a* is a top plan view of the module of FIG. 1*a* defining a second one of the different circuit configurations.

FIG. 3*b* is a schematic diagram of the circuit of FIG. 3*a*.

FIG. 4*a* is a top plan view of the module of FIG. 1*a* defining a third one of the circuit configurations.

FIG. 4*b* is a schematic diagram of the circuit of FIG. 4*a*.

DETAILED DESCRIPTION

Figure 1A:
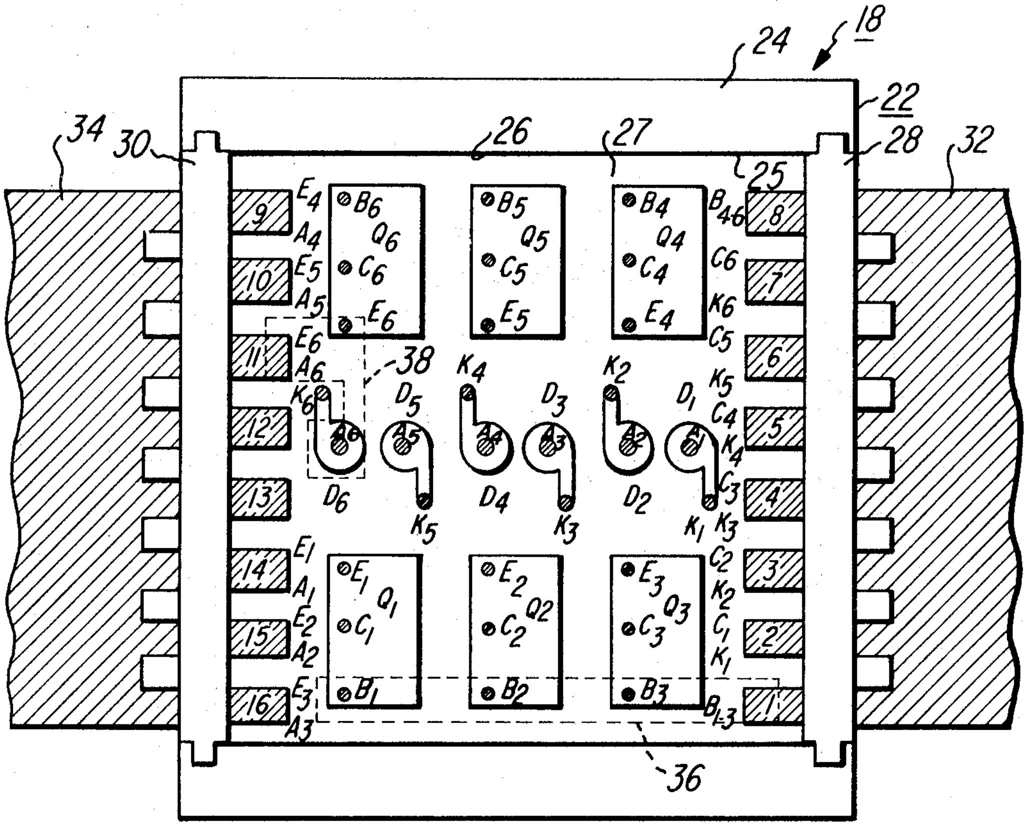

One embodiment of the multicircuit module of the present invention will be described with reference to FIG. 1*a*. Examples I–III thereafter describe three different circuit configurations obtainable from the module of FIG. 1*a*.

The multicircuit module 18 comprises a package 22 which, for power circuit applications as herein described, is preferably a metal of good thermal conductivity; for example, copper or aluminum is suitable. The dimensions of the package 22 are not critical; by way of example, it may be 3.0 inches long, 3.0 inches wide, and 0.5 inch high. The package 22 has an upper surface 24 and a lower surface (not shown). The package 22 also has a cavity 26 therein which extends to the upper surface 24. The cavity 26 is defined by a floor 27 and a sidewall 25. The floor 27 serves as a mounting surface for a plurality of circuit elements, as described below. The body 22 has two opposing sides 28 and 30 each of which comprises an insulating member, such as a molded epoxy resin, or plastic.

The module 18 also includes two flat metal plates 32 and 34, with each plate having a plurality of metal terminal fingers which extend through the insulating members 28 and 30 and into the cavity 26. For example, the right-hand plate 32 (as viewed from the top of FIG. 1*a*) has eight terminal fingers 1–8 which extend through the right insulating member 28 and into the cavity 26; the left-hand plate 34 also has eight terminal fingers 9–16 which extend through the left insulating member 30 and into the cavity 26.

Mounted in the cavity 26 is a plurality of circuit elements capable of a number of different circuit configurations. For example, six transistors $Q_{1-6}$ and six power diodes $D_{1-6}$ are shown in simplified block diagram form mounted on the floor 27 of the cavity 26. When the package 22 comprises a metal, the transistors $Q_{1-6}$ and diodes $D_{1-6}$ may be mounted individually or together on an insulating substrate, such as alumina or beryllia. Each of the transistors $Q_{1-6}$ has emitter, base, and collector electrodes labeled E, B, and C respectively; for example transistor $Q_4$ in the upper right-hand corner of the cavity 26 has an emitter electrode $E_4$, a base electrode $B_4$, and a collector electrode $C_4$. Each of the diodes $D_{1-6}$ has an anode and a cathode electrode labeled A and K respectively; for example, diode $D_3$ has an anode electrode $A_3$ and a cathode electrode $K_3$. As shown in FIG. 1*a*, all of the electrodes $E_{1-6}$, $B_{1-6}$, $C_{1-6}$, $A_{1-6}$, and $K_{1-6}$ extend away from the floor 27 and are substantially parallel to the sidewall 25. The specific structure for the transistors $Q_{1-6}$ and the diodes $D_{1-6}$ is not critical. A suitable structure for the diodes is described by E. Hausman in RCA Technical Note 841, published July 24, 1969; a suitable transistor structure is described by E. Hausman in RCA Technical Note 848, published Sept. 4, 1969.

The module 18 also includes connecting means which are common to all of the different circuit configurations, between the circuit element electrodes (transistors $Q_{1-6}$ and diodes $D_{1-6}$) and the terminal fingers 1–16. In FIG. 1*a*, a portion of the connecting means comprises a flat metal strip 36, shown by a dotted line, which is electrically connected to, and is carried by, base electrodes $B_{1-3}$ of transistors $Q_{1-3}$, and is also electrically connected to terminal finger 1. In a like manner, a second metal strip 38 (also shown by a dotted line) is carried by emitter electrode $E_6$ of transistor $Q_6$ and by anode electrode $A_6$ of diode $D_6$, and is electrically connected to terminal finger 11. Additional flat metal strips, which are not shown, are also provided to interconnect various combinations of the electrodes to the terminal fingers 2–10 and 12–16 in accordance with the legend set out immediately adjacent each terminal finger 1–16 in FIG. 1*a*. For example, collector electrode $C_1$ and cathode electrode $K_1$ are connected to terminal finger 2, collector electrode $C_2$ and cathode electrode $K_2$ are connected to terminal number 3, and so on. The electrodes of the transistors $Q_{1-6}$ and the diodes $D_{1-6}$ may also be connected to the terminal fingers 1–16 by conventional wiring techniques. However, the flat strip arrangement described above is preferred. With the transistors $Q_{1-6}$ and diodes $D_{1-6}$ thus connected to the terminals fingers 1–16 according to the legend set out in FIG. 1*a*, the module 18 has a circuit configuration 40 which is shown schematically in FIG. 1*b*. Thus, terminal fingers 1–8 are connected together by the plate 32 which is common to fingers 1–8, as is shown at the circuit terminal 1–8 in FIG. 1*b*. Terminal fingers 9–16 are likewise connected together by the common plate 34 as is shown at the circuit terminal 9–16 in FIG. 1*b*. The module 18, in this configuration, may then be sealed with a cover over the cavity and a number of different circuit configurations may be selected as set out in examples I–III below.

EXAMPLE I

Figure 1B:
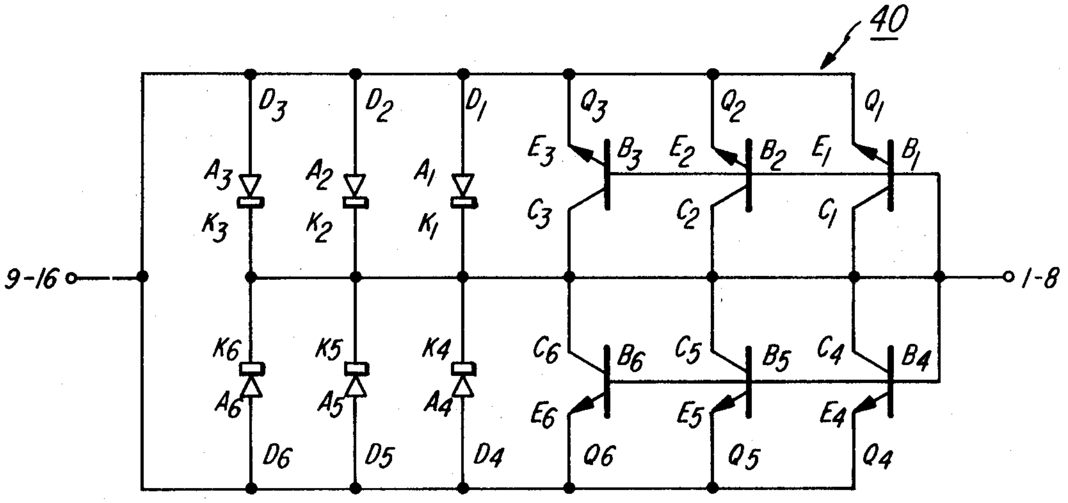
Figure 2A:
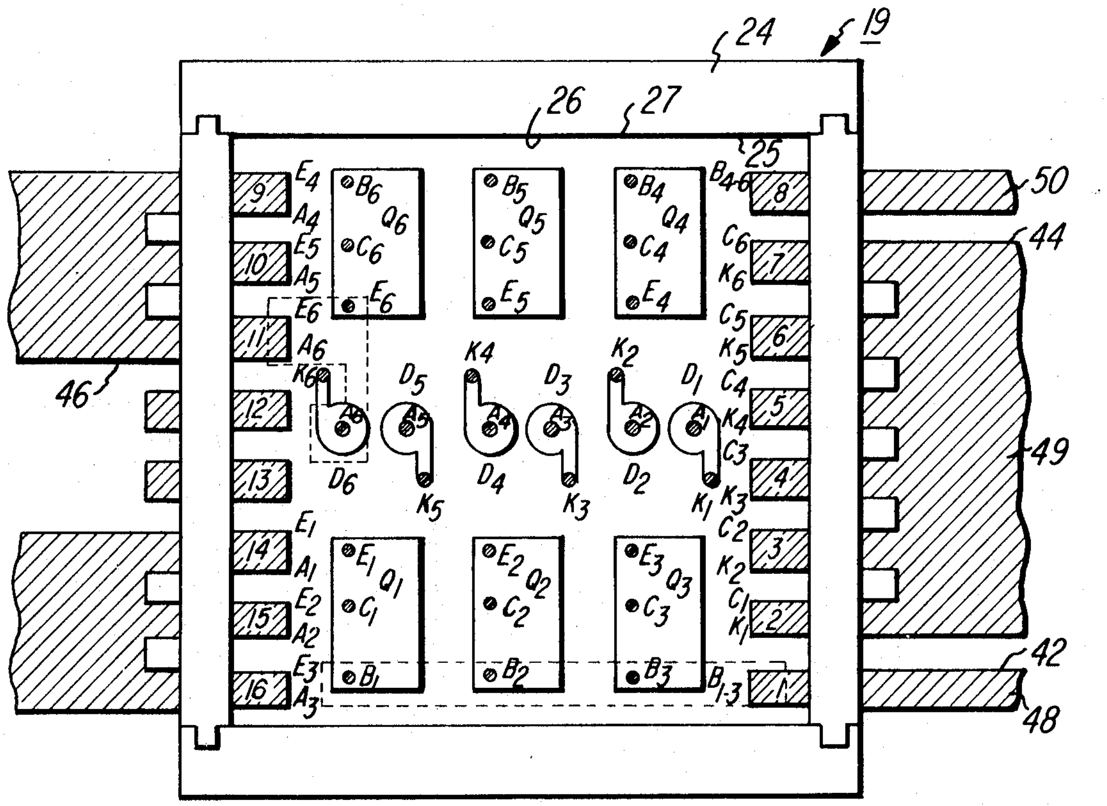

A first circuit arrangement was fabricated from the module 18 of FIG. 1*a*. This circuit module, designated 19, shown in FIG. 2*a*.

Figure 2B:
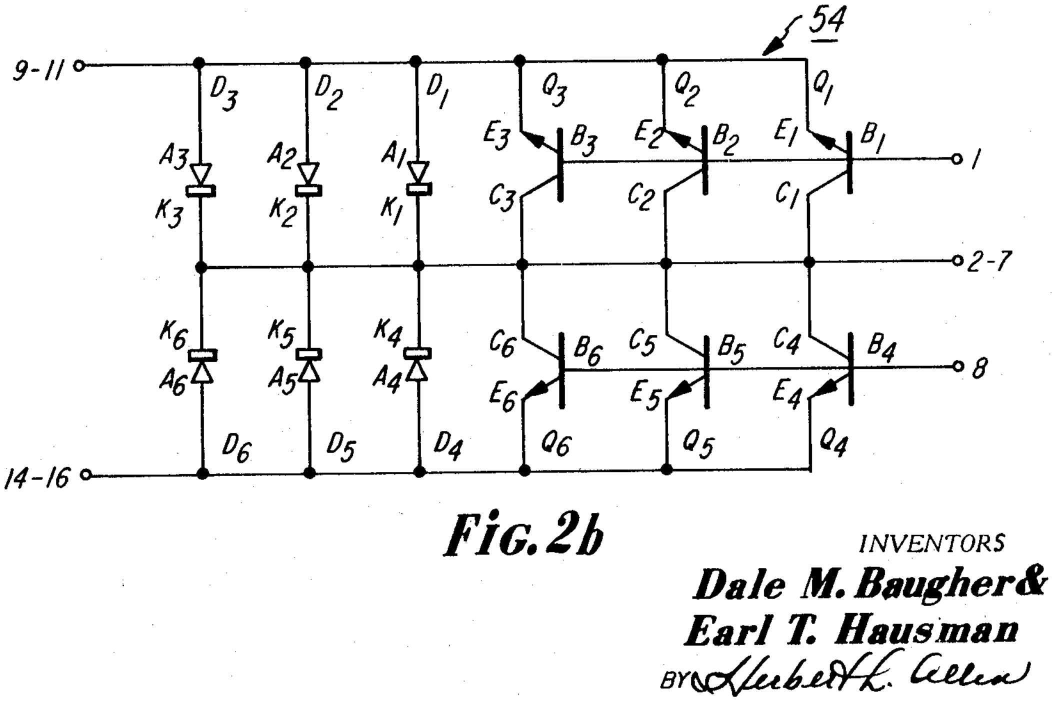

The first circuit module 19 was fabricated from module 18 by shearing out portions of the plate 32 to form a first slot 42 which extends along the plate 32 and between terminal fingers 1 and 2; and shearing a second slot 44 which extends between fingers 7 and 8. A third slot 46 was sheared along the plate 34 between terminal fingers 11 and 14. The resulting circuit module 19 had a flat lead 48 which was connected only to terminal finger 1, and thus only to base electrodes $B_{1-3}$ in transistors $Q_{1-3}$. A second flat lead 50 was common to fingers 2–7, a third flat lead 52 was common only to finger 8, and so on. The resulting first circuit 54 is shown schematically in FIG. 2*b*. This circuit is useful as an output stage for a common collector inverter.

EXAMPLE II

Figure 3A:
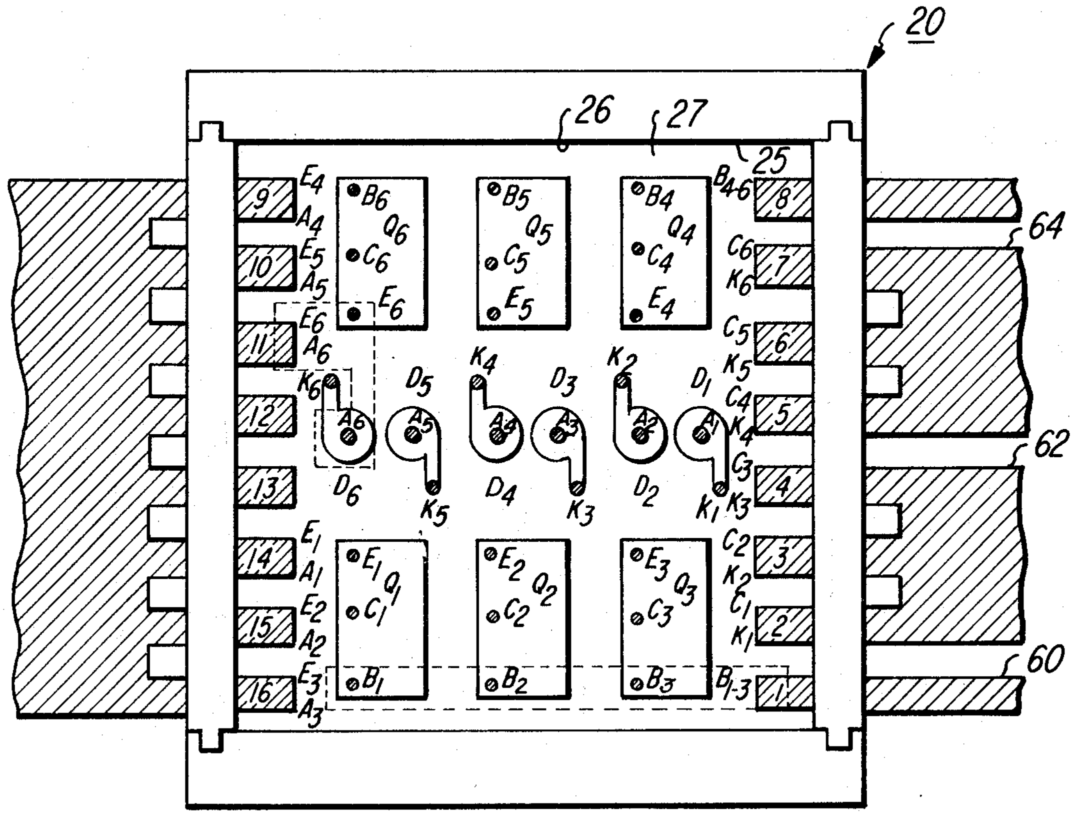
Figure 3B:
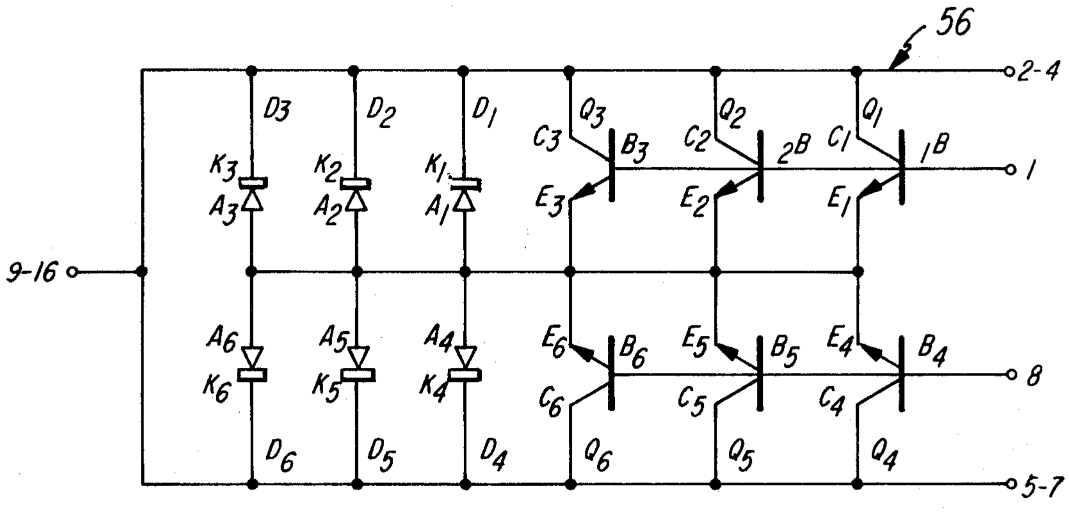

A second circuit module 20 was fabricated from the module 18 of FIG. 1*a* by shearing out a slot 60 in the plate 32, as shown in FIG. 3*a*, between fingers 1 and 2, a slot 62 between fingers 4 and 5, and a slot 64 between fingers 7 and 8. The resulting circuit 56 is shown schematically in FIG. 3*b*. This circuit 56 is useful as an output stage for a common emitter inverter.

EXAMPLE III

Figure 4A:
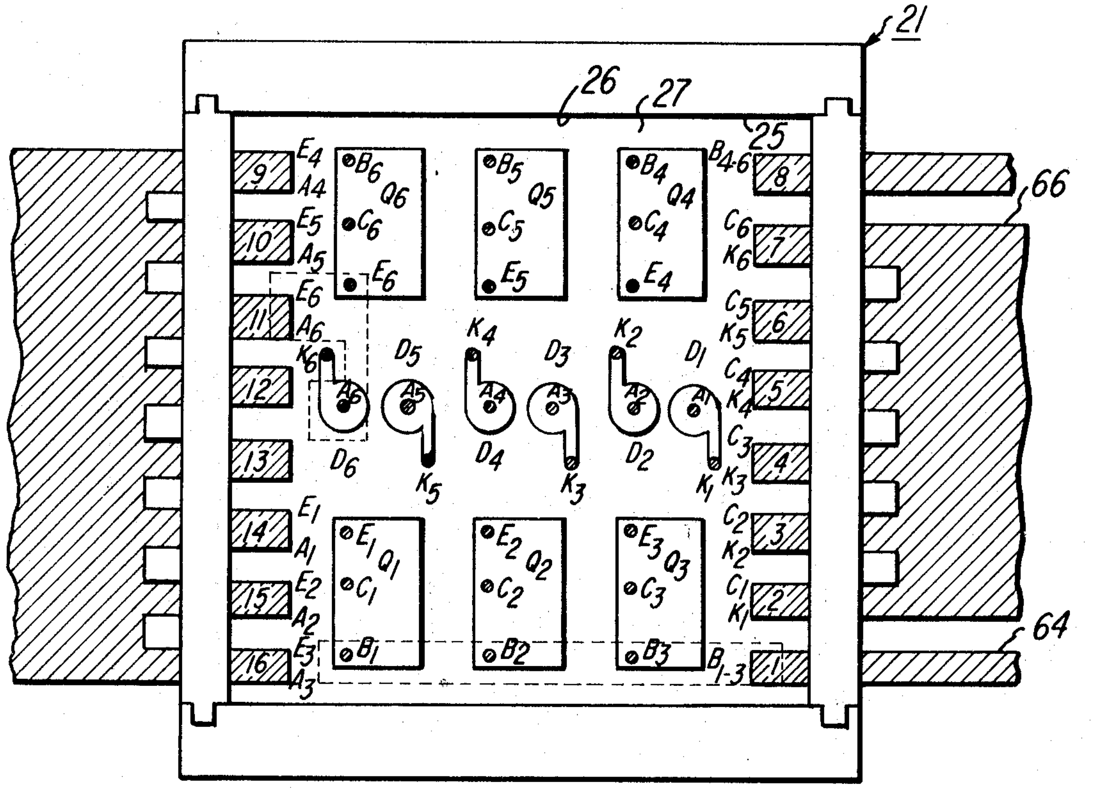
Figure 4B:
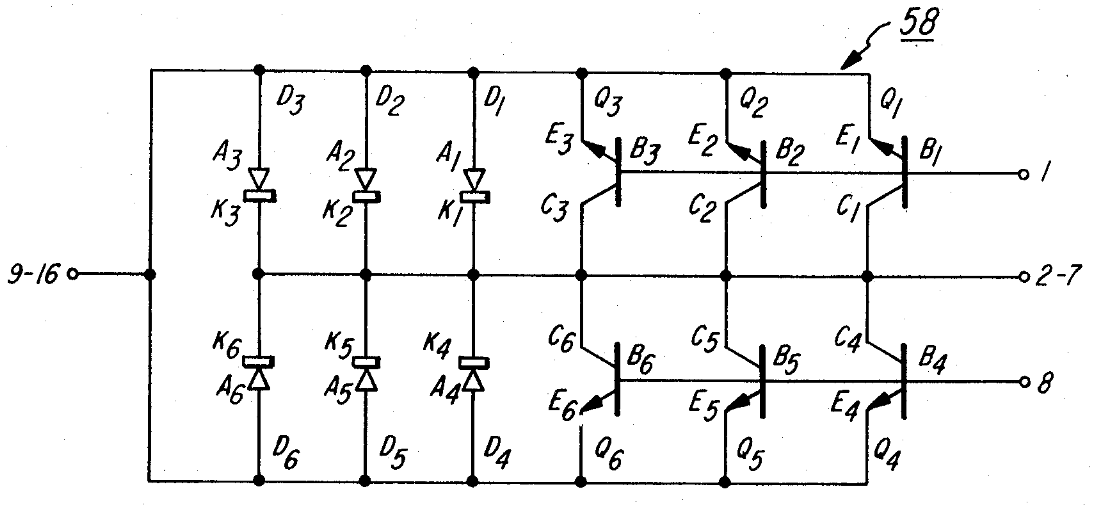

A third circuit module 21 was fabricated from the module 18 of FIG. 1*a* by shearing out a slot 64 in plate 32 as shown in FIG. 4*a* between fingers 1 and 2, and a slot 66 between fingers 7 and 8. The resulting circuit 58 is shown schematically in FIG. 4*b*. This circuit 58 is useful as an output stage for a single-ended switch.

We claim:

1. A modular circuit arrangement comprising:

a package having a mounting surface;

a plurality of circuit elements mounted on said mounting surface said circuit elements being capable of interconnection into a number of different functional circuit configurations;

termination means between said mounting surface and points external to said package;

interconnecting means within said package electrically connecting said circuit elements to said termination means, said interconnecting means being common to all of said functional circuit configurations; and wherein said circuit elements, said common interconnecting means, and said termination means define one of said functional circuit configurations.

2. A module circuit arrangement according to claim 1, wherein said package has a cavity defined by a sidewall and a floor which comprises said mounting surface, and wherein said circuit elements comprise:

a plurality of semiconductor devices mounted on said floor;

each said semiconductor device having at least two electrodes extending away from said floor and parallel to said sidewall.

3. A modular circuit arrangement according to claim 2, wherein said connecting means comprises a plurality of flat metal plates carried by said electrodes.

4. A modular circuit arrangement according to claim 3, wherein said package includes an insulating member, said member having a major surface comprising said sidewall, and wherein said termination means comprises:

a flat metal plate having a plurality of metal fingers extending through said insulating member and into said cavity, said fingers connected to said connecting means; and said plate having at least one slot along said plate and extending between at least two of said fingers so as to define said one circuit configuration.

5. A method for defining one circuit configuration in a modular circuit arrangement capable of a number of different circuit configurations, said method comprising:

providing a package having a mounting surface;

mounting a plurality of circuit elements on said mounting surface;

providing a pattern of internal connections between said circuit elements and a plurality of metal fingers on the periphery of said mounting surface, such that when external connections are made to said fingers, different circuit configurations can be obtained without changing said internal connections;

providing an external metal plate common to all of said fingers;

shearing said plate so as to isolate certain of said fingers and thus define said one circuit configuration.

* * * * *